United States Patent [19]

Bucker

[11] 4,387,116
[45] Jun. 7, 1983

[54] CONDITIONER FOR ADHERENCE OF NICKEL TO A TIN OXIDE SURFACE

[75] Inventor: Edward R. Bucker, Cranford, N.J.

[73] Assignee: Exxon Research and Engineering Co., Florham Park, N.J.

[21] Appl. No.: 335,229

[22] Filed: Dec. 28, 1981

[51] Int. Cl.³ .............................................. B23C 3/02
[52] U.S. Cl. .................................... 427/75; 156/662; 427/92; 427/93; 427/108; 427/259; 427/305
[58] Field of Search .................... 427/74, 75, 92, 108, 427/305, 259, 93; 136/256; 156/662

[56] References Cited

U.S. PATENT DOCUMENTS 4,359,487 11/1982 Schneider ........................... 427/75

OTHER PUBLICATIONS

Takakura et al. "Low Cost High-Efficiency SnO$_2$/n+-pSi Heteroface Solar Cell . . . ", Conference: 14th IEEE Photovoltaic Specialists Conference, 1980, San Diego, CA, U.S.A., (Jan. 7-10, 1980).

Schunck et al. "Efficient Indium Tin Oxide/Polycrystalline Silicon Solar Cells", Appl. Phys. Lett. 35 (11), Dec. 1, 1979.

Tanner et al., "An All-Plated, Low Cost Contact System for Silicon Solar Cells", Conference: 14th IEEE Photovoltaic Specialists Conference 1980, San Diego, CA, U.S.A. (Jan. 7-10, 1980).

Goldie, Metallic Coating of Plastics, Electrochemical Publication Limited, 1968, pp. 39-52.

Primary Examiner—John D. Smith
Attorney, Agent, or Firm—Ronald D. Hantman

[57] ABSTRACT

The present invention is a solution and a method for its use in adhering nickel to a tin-oxide surface.

5 Claims, 3 Drawing Figures 4,387,116

CONDITIONER FOR ADHERENCE OF NICKEL TO A TIN OXIDE SURFACE

BACKGROUND OF THE INVENTION

The present invention relates to the adherence of nickel to any substance with a tin oxide surface.

There has been considerable interest in recent years towards the development of optical electronic devices comprising an electrically conducting transparent window material deposited on a semi-conductive substrate. Such interest is based on the potential that devices can be fabricated at lower costs than homojunction devices based on the conventional diffusion of N and/or P materials on a surface. Additionally, such devices offer the added advantage that the transparent window permits the transmission of a solar radiation directly to the active substrate with little or no attenuation. One such type of material proposed is a tin oxide layer on a conductive substrate.

In order to convert the solar energy to electrical energy, electrodes must be applied to the cell. The present invention is concerned with this problem.

SUMMARY OF THE INVENTION

The present invention is a solution and a method for its use in adhering nickel to a tin-oxide surface. The solution includes:

(a) tin chloride.$2H_2O$ from 50 to 100 gms per liter;

(b) hydrochloric acid in an amount of 200 to 400 ml per liter;

(c) hydrofluoric acid in an amount of 25 to 100 ml per liter;

(d) water in an amount to make one liter.

The solution is used by immersing the tin-oxide surface into the solution for 30 seconds to 5 minutes at 60°–100° C. The treated tin-oxide surface is then sensitized and electrolessly plated with a layer including nickel.

In a preferred embodiment, the solution and method is to apply electroless nickel to a solar cell with a tin-oxide surface.

BRIEF DESCRIPTION OF THE DRAWINGS

In the drawings, where like components are commonly designated.

DESCRIPTION OF THE PREFERRED EMBODIMENT

The present invention is a solution and a method for its use in adhering nickel to tin-oxide. The solution includes tin chloride.$2H_2O$ from 30 to 100 gm per liter, hydrochloric (35–38%) acid in an amount of 200 to 400 ml per liter, hydrofluoric acid in an amount 25 to 100 ml per liter, and water making up the remainder.

A preferred composition is tin chloride.$2H_2O$, 60 gms; hydrochloric acid, 300 ml; hydrofluoric acid (48–49%), 45 ml; and water to make up the remainder.

The solution is prepared by mixing together the tin chloride, hydrochloric acid, and water, for a time sufficient to dissolve the tin chloride.$2H_2O$. It should take about 15 to 20 minutes when heated to 80°–85° C. Thereafter, the hydrofluoric acid is slowly added to the mixture. The hydrofluoric acid is added slowly after the tin chloride is dissolved, to avoid its evaporation and formation of a precipitate. The temperature of the mixture is maintained at about 70° to 90° C. during the preparation and use. A preferred temperature is about 80° C.

Figure 1:
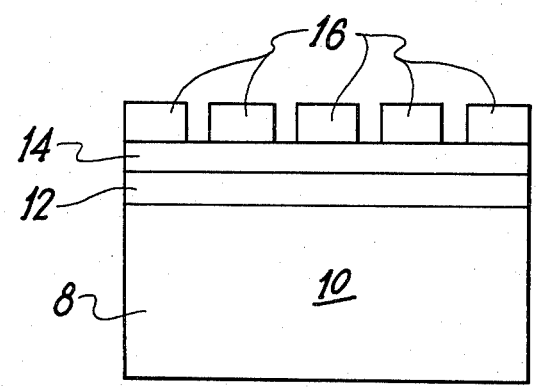
FIGS. 1 through 3 illustrate cross-sectional views of the solar cell during successive steps in the fabrication technique of a preferred embodiment of the present invention.

In a preferred embodiment of the present invention, electroless nickel is applied to the surfaces of a tin oxide-silicon solar cell using the conditioner disclosed herein. Referring to FIG. 1, a solar cell 10 having a tin-oxide layer 12 on a silicon substrate 8 is shown. Electrodes must be plated to the tin oxide-silicon heterojunction for use as a solar cell 10. However, it is desirable to protect the tin-oxide surface while the electrodes are being prepared. A suitable protection for the tin-oxide surface is achieved by applying to the surface an amount of spin-on coating material 14, such as a solution of silicon oxide in alcohol-based solvent, commercially available from Emulsiton Corporation under the trade-name of "Silicafilm $SiO_2$ Layer". The coating is applied by the known technique of contacting the cell surface with the coating liquid and spinning the cell in commercial photo-resist spinner means. Layer thickness is controlled by regulating the amount of liquid applied to the surface and the spinning speed which controls the centrifugal liquid spreading force. This layer is to protect the tin oxide surface from the flux to be used in the final preparation step; i.e., soldering. The spin-on coated layer 14 is then densified by heat treating the cell at a temperature ranging from about 150° C. to about 200° C. for a time ranging from about 15 minutes to about 30 minutes.

Figure 2:
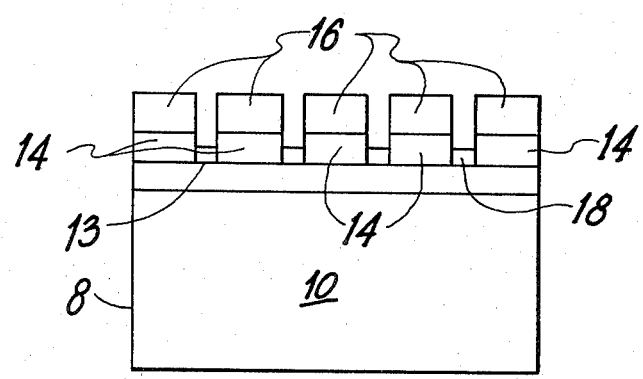

The coated surface 14 is then masked to expose only that area of the cell surface which corresponds to the desired electrode pattern. Accordingly, layer 16 is applied via a silk-screened, asphalt-based, ink mask patterned onto layer 14. The masked surface is then contacted with an etchant chosen to provide selective etching of the coating employed. For example, an etching solution of buffered hydrofluoric acid is used to selectively remove the coating in the unmasked regions of the cell surface. Referring to FIG. 2, it is to be recognized that the etching solution is chosen to selectively etch the coating 14 in preference to the underlying tin-oxide layer 12. Furthermore, the solution concentration of the etchant is selected to minimize etchant undercutting of the mask. Accordingly, the etching solution removes the unmasked regions of layer 14 which correspond to the desired electrode pattern, exposing the underlying tin-oxide surface 13.

The exposed surface 13 is immersed in the conditioner described above for 1 to 3 minutes, preferably about 2 minutes, at 80° C.

The cell is then prepared for plating by contacting the conditioned tin-oxide regions 13 with an electroless nickel sensitizer, such as commercially available palladium solution or gold chloride, for 15 to 30 seconds. The cell is then rinsed in water. The cell is then subjected to electroless nickel plating which comprises contacting at least the sensitized exposed silicon regions with an electroless nickel plating solution to electrolessly plate a layer of nickel 18 onto the sensitized exposed tin-oxide surface 13. Nickel layer 18 in the region contacting the formerly exposed silicon surface is about 0.1 microns in thickness.

Figure 3:
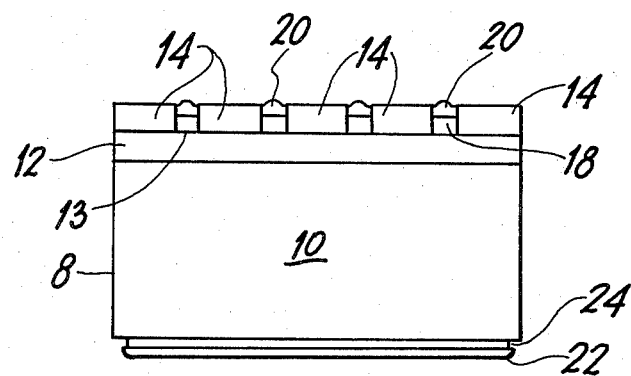

Subsequent to the electroless nickel deposition, masking layer 16 is removed using a suitable solvent. The removal of masking layer 16 further removes stray nickel deposition which may at least partially overcoat masking layer 16. Referring to FIG. 3, the removal of masking layer 16 produces a cell having a coating 14 and an inter-dispersed electrode 18.

Electrolessly-deposited nickel layer 18 is insufficiently conductive to serve as a suitable current carrying electrode for most solar cell applications. Accordingly, a conduction supportive electrode layer 20, comprising a relatively high electroconductivity metal, may be formed by solder-dipping, electroplating, or the like. In a preferred embodiment, the surface area of the cell, comprising at least the nickel electrode 18, is contacted first with a solder flux agent and then with molten solder, to form layer 20 comprising solder.

An ohmic electrode may be formed concurrent to the formation of layers 18 and 20, comprising a first-region 24 layer of electroless nickel and a second-region layer 22 comprising solder, for example, as taught with respect to layer 18.

What is claimed is:

1. A method for electrolessly plating a layer of nickel onto a conditioned tin oxide surface, comprising:
   (a) immersing said surface into a solution including tin chloride.2H$_2$O from 30 to 100 gms per liter, hydrochloric acid in an amount of 200 to 400 ml per liter, hydrofluoric acid in an amount of 25 to 100 ml per liter, water in an amount to make one liter;
   (b) sensitizing said tin oxide surface; and
   (c) plating, electrolessly a layer including nickel onto said conditioned and sensitized tin oxide surface.

2. A method for forming the electrodes to a tin oxide surface of a solar cell comprising:
   (a) protecting a portion of said tin oxide surface, leaving an exposed portion to which said electrodes are formed;
   (b) immersing said exposed portions of said tin-oxide surface into a solution including tin chloride.2H$_2$O from 30 to 100 gms per liter; hydrochloric acid in an amount of 200 to 400 ml per liter; hydrofluoric acid in an amount of 25 to 100 ml per liter; water in an amount to make one liter;
   (c) rinsing said exposed portion of said tin-oxide surface;
   (d) contacting said exposed portion of conditioned tin-oxide surface with an electroless nickel sensitizer;
   (e) plating, electrolessly, a layer of nickel onto said exposed portion of said tin oxide surface; and
   (f) coating said nickel layer with a layer of conduction material.

3. The method of claim 1 wherein said solution is between 70° C. and 90° C.

4. The method of claim 3 wherein said tin oxide is immersed in said solution for a period of 1 minute to 3 minutes at 80° C.

5. The method of claim 2 wherein the protecting step is performed by:
   (a) coating said tin-oxide surface with silicon oxide in an alcohol-based solution;
   (b) masking a portion of said coated surface to form an electrode pattern which remains unmasked;
   (c) etching said coating in the unmasked portion to remove said silicon oxide, thereby leaving said exposed portion of said tin-oxide surface; and
   (d) removing said masking after said layer of nickel is electrolessly plated to said tin-oxide surface.

* * * * *